United States Patent
Araki et al.

(10) Patent No.: US 12,416,075 B2
(45) Date of Patent: Sep. 16, 2025

(54) FILM-FORMING METHOD AND FILM-FORMING SYSTEM

(71) Applicant: Tokyo Electron Limited, Tokyo (JP)

(72) Inventors: Masato Araki, Nirasaki (JP); Tadahiro Ishizaka, Nirasaki (JP); Kohichi Satoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 285 days.

(21) Appl. No.: 17/932,341

(22) Filed: Sep. 15, 2022

(65) Prior Publication Data

US 2023/0090881 A1 Mar. 23, 2023

(30) Foreign Application Priority Data

Sep. 21, 2021 (JP) .................. 2021-153187

(51) Int. Cl.
*C23C 16/16* (2006.01)
*C23C 16/56* (2006.01)
*H01L 21/02* (2006.01)

(52) U.S. Cl.
CPC .............. *C23C 16/16* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 2002/0070194 A1* | 6/2002 | Nakahara | H01L 21/32136 216/2 |
| 2005/0186341 A1* | 8/2005 | Hendrix | C23C 16/16 427/248.1 |
| 2013/0059078 A1* | 3/2013 | Gatineau | C23C 16/18 427/248.1 |
| 2016/0166868 A1* | 6/2016 | Dickinson | H01J 37/32844 588/406 |
| 2016/0240433 A1* | 8/2016 | Ishizaka | H01L 21/76843 |
| 2018/0211872 A1* | 7/2018 | Wu | H01L 21/76876 |
| 2019/0214296 A1 | 7/2019 | Wang et al. | |
| 2020/0157680 A1* | 5/2020 | Chen | C23C 16/06 |
| 2021/0047725 A1* | 2/2021 | Woodruff | C23C 16/45527 |

FOREIGN PATENT DOCUMENTS

| | | |
|---|---|---|
| JP | 2018-147949 A | 9/2018 |
| JP | 2020-047864 A | 3/2020 |
| KR | 10-2001-0066747 A | 7/2001 |
| KR | 10-2001-0097410 A | 11/2001 |
| KR | 10-2009-0111258 A | 10/2009 |

\* cited by examiner

*Primary Examiner* — Shamim Ahmed
(74) *Attorney, Agent, or Firm* — Armstrong Teasdale LLP (57) ABSTRACT

A film-forming method of embedding ruthenium in a substrate having a recess includes: (a) providing the substrate in a processing container; (b) supplying a gas containing a ruthenium raw material gas into the processing container to form a ruthenium layer; (c) annealing the ruthenium layer; and (d) supplying a gas containing an ozone gas into the processing container to etch the ruthenium layer, wherein (b), (c), and (d) are repeatedly executed in this order.

4 Claims, 6 Drawing Sheets

FILM-FORMING METHOD AND FILM-FORMING SYSTEM

CROSS-REFERENCE TO RELATED APPLICATION

This application is based upon and claims the benefit of priority from Japanese Patent Application No. 2021-153187, filed on Sep. 21, 2021, the entire contents of which are incorporated herein by reference.

TECHNICAL FIELD

The present disclosure relates to a film-forming method and a film-forming system.

BACKGROUND

Low-resistance ruthenium (Ru) is attracting attention as material for minute shapes of wires that interconnect transistors, contacts, and the like formed on a substrate. For example, Patent Documents 1 and 2 propose a technique of embedding ruthenium in a recess formed in a substrate. In realizing low-resistance wires and contacts, it is important to embed ruthenium in recesses without generating voids that increase resistance.

PRIOR ART DOCUMENT

Patent Document

Patent Document 1: Japanese Patent Laid-Open Publication No. 2018-147949
Patent Document 2: Japanese Patent Laid-Open Publication No. 2020-47864

SUMMARY

According to an embodiment of the present disclosure, a film-forming method of embedding ruthenium in a substrate having a recess includes: (a) providing the substrate in the processing container; (b) supplying a gas containing a ruthenium raw material gas into the processing container to form a ruthenium layer; (c) supplying a gas containing an ozone gas into the processing container to etch the ruthenium layer; and (d) a step of annealing the ruthenium layer, wherein (b), (c), and (d) are repeatedly executed in this order.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components may be denoted by the same reference numerals, and redundant descriptions thereof may be omitted.

[Film-Forming System]

Figure 1:
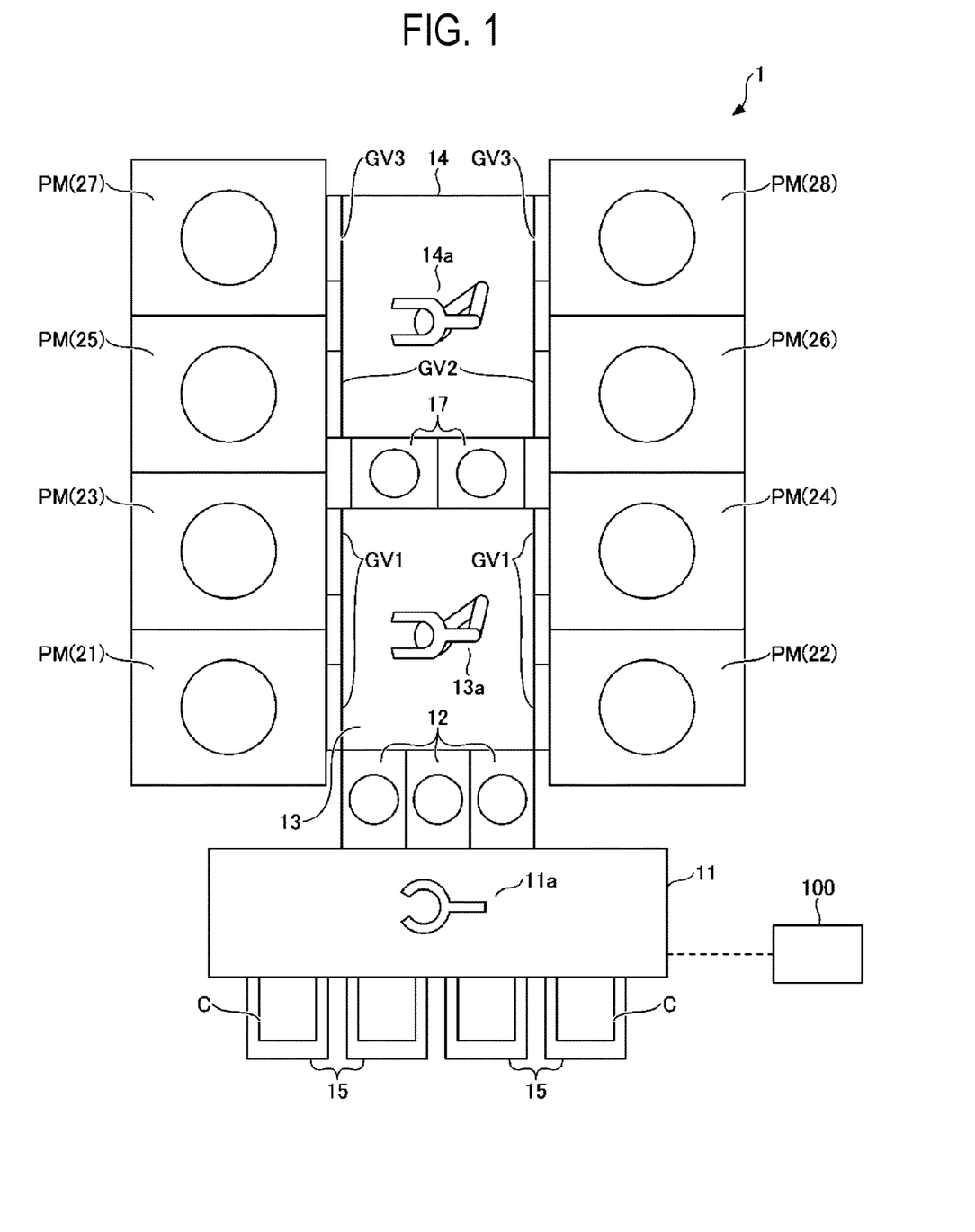
FIG. 1 is a schematic plan view illustrating an example of a film-forming system according to an embodiment of the present disclosure.

First, a configuration and an operation of a film-forming system 1 according to an embodiment of the present disclosure will be described with reference to FIG. 1. FIG. 1 is a schematic plan view illustrating an example of a film-forming system according to the embodiment. The film-forming system 1 executes a process including embedding ruthenium in a recess formed on a substrate.

The film-forming system 1 include an atmospheric transport chamber 11, load-lock chambers 12, a first substrate transport chamber 13, a second substrate transport chamber 14, and processing chambers PM. In FIG. 1, the processing chambers PM include cleaning apparatuses 21 and 22, film-forming apparatuses 23 to 27, and an annealing apparatus 28. The film-forming apparatuses may include a film-forming apparatus configured to embed ruthenium in a recess formed in a substrate and a film-forming apparatus configured to laminate ruthenium in which ruthenium is further laminated on the embedded ruthenium to form a flat ruthenium layer.

The numbers and arrangements of cleaning apparatuses, film-forming apparatuses, and annealing apparatuses are not limited to the example illustrated in FIG. 1, and the numbers and arrangements of respective apparatuses may be set to improve the overall throughput. For example, two cleaning apparatuses, three film-forming apparatuses configured to embed ruthenium, one film-forming apparatus configured to laminate ruthenium, and two annealing apparatuses may be provided and arranged at appropriate positions of eight processing chambers PM. When the annealing apparatuses take time, one cleaning apparatus, four film-forming apparatuses configured to embed ruthenium, one film-forming apparatus configured to laminate ruthenium, and two annealing apparatuses may be provided and arranged at appropriate positions of eight processing chambers PM.

The first substrate transport chamber 13 and the second substrate transport chamber 14 are each configured in a quadrangular shape in a plan view, and are connected to each other via, for example, two transfers 17. The interiors of the first and second substrate transport chambers 13 and 14 and the transfers 17 are set to a vacuum pressure atmosphere and configured to have uniform pressures. The transfers 17 perform substrate delivery to and from a first transport mechanism 13a provided at the first substrate transport chamber 13 or to and from a second transport mechanism 14a provided at the second substrate transport chamber 14. The first substrate transport chamber 13 and the second substrate transport chamber 14 each include a turbo molecular pump (not illustrated) for a transport chamber to control the interior of each transport chamber to a desired pressure.

It is assumed that the direction in which the first substrate transport chamber 13 and the second substrate transport chamber 14 are arranged is referred to as a length direction, and that the first substrate transport chamber 13 is on the front side and the second substrate transport chamber 14 is on the rear side. At this time, the atmosphere transport chamber 11 set to the atmospheric pressure atmosphere is connected to the front side of the first substrate transport chamber 13 via, for example, three load-lock chambers 12. There are substrate transport ports and gate valves configured to open and close the substrate transport ports are provided, respectively, between the first and second substrate transport chambers 13 and 14 and the transfers 17, between the load-lock chambers 12 and the first substrate transport chamber 13, and between the load-lock chambers 12 and the atmospheric transport chamber 11, but the illustration thereof is omitted.

For example, four load ports 15 are connected to the atmospheric transport chamber 11, and a carrier C accommodating substrates is placed in each load port 15. The atmospheric transport chamber 11 is provided with an atmospheric transport mechanism 11a to transport substrates between the carriers C connected to the atmospheric transport chamber 11 and the load-lock chambers 12.

The cleaning apparatuses 21 and 22 are connected, respectively, to two walls at the front side of the first substrate transport chamber 13. The cleaning apparatuses 21 and 22 perform a pre-cleaning process of removing a metal oxide as a preprocess for a process of embedding ruthenium. For example, the cleaning apparatuses 21 and 22 remove a metal oxide that is a lower layer of a recess included in a substrate. When the lower layer of the recess included in the substrate is a tungsten layer, the cleaning apparatuses 21 and 22 remove a tungsten oxide formed due to oxidation of tungsten. In addition, for example, when the lower layer of the recess in the substrate is a ruthenium layer, the cleaning apparatuses 21 and 22 remove a ruthenium oxide film formed due to oxidation of ruthenium. The cleaning apparatuses 21 and 22 reduce and remove a metal oxide by hydrogen plasma obtained by forming hydrogen gas into plasma.

The film-forming apparatuses 23 and 24 are connected, respectively, to two walls at the inner side of the first substrate transport chamber 13. The first transport mechanism 13a provided at the first substrate transport chamber 13 transports substrates among these four processing chambers PM (21 to 24), the transfers 17, and the load-lock chambers 12. In FIG. 1, the reference numeral GV1 indicates gate valves.

The film-forming apparatuses 25 and 26 are connected, respectively, to two walls at the front side of the second substrate transport chamber 14. In this example, the film-forming apparatuses 25 and 26 are film-forming apparatuses configured to embed ruthenium.

The film-forming apparatus 27 and the annealing apparatus 28 are connected, respectively, to two walls at the inner side of the second substrate transport chamber 14. Then, the second transport mechanism 14a transports substrates between these four processing chambers PM (25 to 28) and the transfers 17. In FIG. 1, the reference numerals GV2 and GV3 indicate gate valves, respectively. The film-forming apparatus 27 is a film-forming apparatus configured to laminate ruthenium.

In this example, the film-forming apparatus 23 to 26 each embed ruthenium in a recess in a bottom-up manner by using a raw material gas containing $Ru_a(CO)_{12}$ (hereinafter, also referred to as DCR) as a ruthenium raw material. The film-forming apparatus 27 forms ruthenium up to a field portion by using a raw material gas containing DCR. This is a process of stacking ruthenium layers for a flattening process (CMP) in the next step.

The annealing apparatus 28 anneals a formed ruthenium film. The annealing apparatus 28 is an apparatus capable of heating a substrate by a heating part such as a heater.

The film-forming system 1 includes a controller 100 that controls an operation of each component constituting the film-forming system 1, such as various processes in the cleaning apparatuses 21 and 22, the film-forming apparatuses 23 to 27, and the annealing apparatus 28, or substrate transportation. The controller 100 includes, for example, a computer including a CPU (not illustrated) and a memory (storage), and the memory stores a control program used in the operation of each part constituting the film-forming system 1. The control program may be stored in a storage medium such as a hard disk, a compact disk, a magneto-optical disk, a memory card, or a non-volatile memory, and may be installed in the computer from the storage medium. The control program may be acquired from a network connected to the controller 100 by using communication means.

As described above as an example, the film-forming system 1 includes at least one film-forming apparatus configured to form the ruthenium film, and the film-forming apparatus is used to embed ruthenium in a substrate having a recess. In this example, the film-forming apparatuses 23 to 27 have the same configuration, but the film-forming apparatus 27 may not include some components of the film-forming apparatuses 23 to 26 (an ozone gas supply line and the like, which will be described later). In addition, the film-forming system 1 includes at least one annealing apparatus that anneals ruthenium to heat a ruthenium layer embedded in the recess of the substrate.

[Film-Forming Apparatus]

Figure 2:
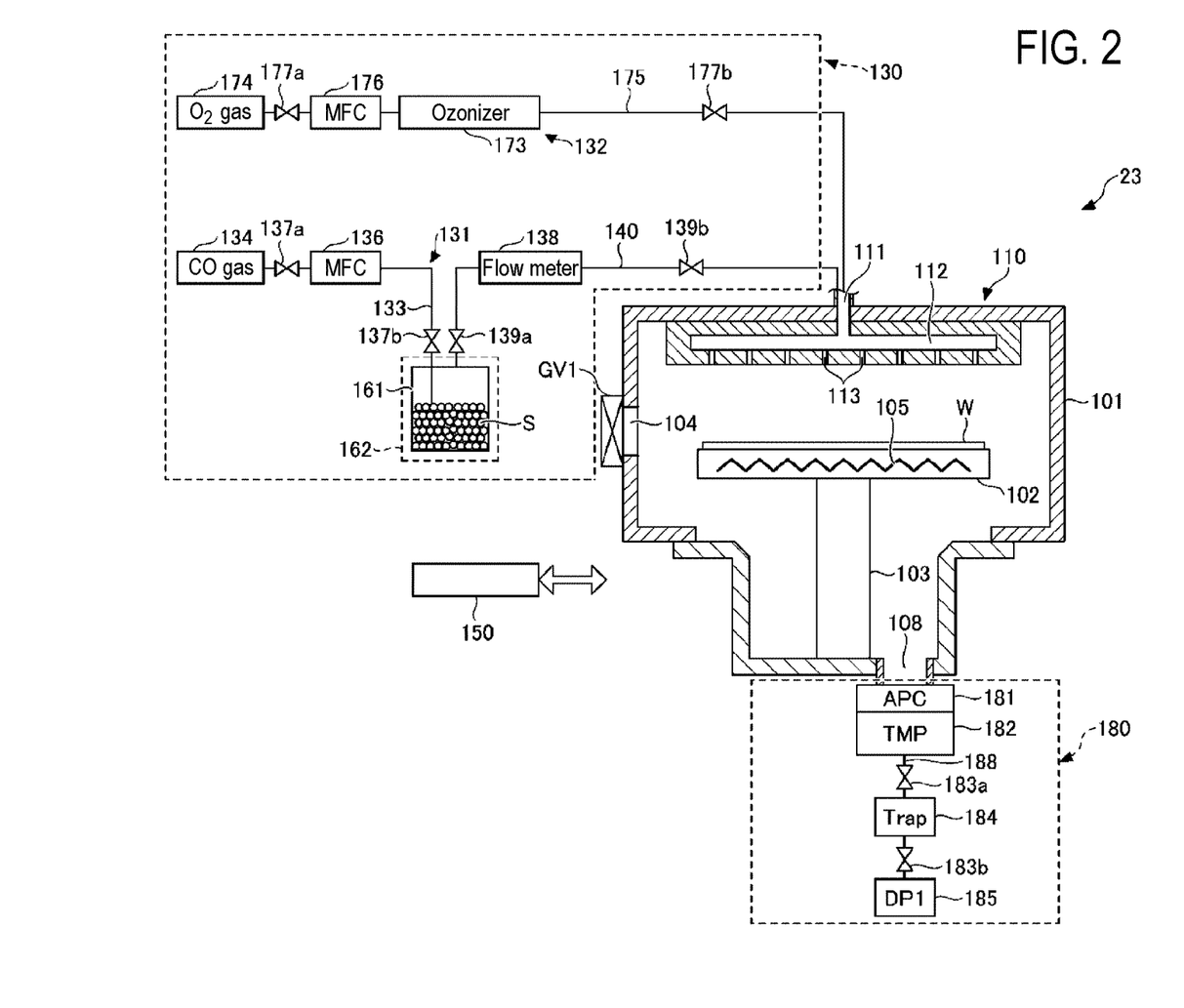
FIG. 2 is a schematic cross-sectional view illustrating an example of a film-forming apparatus according to an embodiment of the present disclosure.

Next, a configuration of a film-forming apparatus included in the film-forming system 1 according to an embodiment of the present disclosure will be described with reference to FIG. 2. Here, the configuration of the film-forming apparatus 23 will be described as an example, and the description of the film-forming apparatus 24 to 27 having the same configuration will be omitted. FIG. 2 is a schematic cross-sectional view illustrating an example of the film-forming apparatus 23 according to the embodiment of the present disclosure. The illustration of the configurations of the cleaning apparatuses 21 and 22 and the annealing apparatus 28 are omitted.

The film-forming apparatus 23 includes a processing container 101, and the side wall of the processing container 101 is provided with a transport port 104 connected to the second substrate transport chamber 14 and configured to load and unload the substrate into and from the second substrate transport chamber 14. The transport port 104 is configured to be openable and closable by the gate valve GV1.

In the processing container 101, a stage 102 configured to horizontally support a substrate W is provided in a state where a bottom surface of the stage 102 is supported by a support pillar 103. The stage 102 includes a heater 105, and is configured to be capable of heating the substrate W to a preset temperature.

A shower head 110 is disposed on a ceiling of the processing container 101 so as to face the substrate W placed on the stage 102. The shower head 110 includes a gas diffusion space 112, and gas ejection ports 113 are formed to be distributed at the bottom surface of the shower head 110.

Further, the film-forming apparatus 23 includes a gas supply 130 configured to supply gas and a gas exhaust 180 configured to exhaust gas. The gas supply 130 includes a first supply line 131 configured to supply a gas containing a ruthenium raw material gas to the processing container 101, and a second supply line 132 configured to supply a gas containing an ozone gas.

The first supply line 131 includes a carrier gas supply pipe 133 and a supply pipe 140. The carrier gas supply pipe 133 extends from a CO gas source 134 and is connected to a raw material container 161. The end of the supply pipe 133 is provided to be inserted into a raw material S. The supply pipe 133 is provided with a valve 137a, a mass flow controller 136, and a valve 137b in this order from the CO gas source 134. A CO gas as a carrier gas is supplied to the raw material container 161 from the CO gas source 134 via the supply pipe 133. However, as the carrier gas, an inert gas such as argon (Ar) gas or nitrogen ($N_2$) gas may be used instead of the CO gas.

The raw material container 161 accommodates the raw material S of ruthenium. In this example, DCR is accommodated in the raw material container 161 as the raw material S of the ruthenium film, but the raw material S of the ruthenium film is not limited to DCR and may be an organic gas. The raw material S in the raw material container 161 is heated by a heater 162 to be vaporized.

The raw material container 161 and a gas introduction port 111 of the shower head 110 are connected to each other by the supply pipe 140. The upper end surface of the raw material container 161 is connected to the supply pipe 140 and is connected to the gas introduction port 111. The supply pipe 140 is provided with a valve 139a, a flow meter 138, and a valve 139b in this order from the raw material container 161.

The ruthenium raw material gas vaporized in the raw material container 161 flows through the supply pipe 140 by using CO gas as a carrier gas, and is supplied to the processing container 101 from the gas introduction port 111. The flow meter 138 detects a flow rate of a gas containing the raw material gas. A ruthenium film is formed in a recess in the surface of a substrate W by the raw material gas supplied from the first supply line 131 to the processing container 101.

The second supply line 132 includes a supply pipe 175. The supply pipe 175 extends from the $O_2$ gas source 174 and is connected to the gas introduction port 111. The supply pipe 175 is provided with a valve 177a, a mass flow controller 176, an ozonizer 173, and a valve 177b in this order from the $O_2$ gas source 174.

The flow rate of the oxygen gas supplied from the $O_2$ gas source 174 is controlled by the mass flow controller 176, and the oxygen gas is supplied to the ozonizer 173. The ozonizer 173 discharges the oxygen gas by electric energy to produce ozone gas, controls a concentration of the ozone gas relative to the oxygen gas, and outputs a mixed gas of the ozone gas and the oxygen gas at a certain controlled concentration. The mixed gas of the ozone gas and the oxygen gas is an example of the gas containing ozone gas. The gas containing ozone gas is supplied to the processing container 101 through the supply pipe 175. As a result, ruthenium pieces formed on the side wall of the recess are etched and removed.

The gas exhaust 180 includes an exhaust pipe 188 of the exhaust line. The exhaust pipe 188 is connected to an exhaust pipe 108 provided at the bottom wall of the processing container 101 via a pressure adjuster (APC) 181 and a turbo molecular pump (TMP) 182.

The exhaust pipe 188 extends from a dry pump (DP1) 185 and is connected to the turbo molecular pump (TMP) 182. The exhaust pipe 188 is provided with a valve 183b, a trap device 184, and a valve 183a in this order from the dry pump (DP1) 185. The dry pump (DP1) 185 roughly exhausts the interior of the processing container 101, and the turbo molecular pump 182 vacuumizes the interior of the processing container 101 while adjusting the pressure inside the processing container 101 by the pressure adjuster 181 to exhaust the residual gas of the ruthenium raw material gas. At that time, the raw material gas is recovered by the trap device 184. The exhaust pipe 188 exhausts the residual gas of the gas containing the ozone gas.

The film-forming apparatus 23 includes a controller 150 that controls the operation of each component constituting the film-forming apparatus 23. The controller 150 includes, for example, a computer including a CPU (not illustrated) and a memory (a storage), and the memory stores a process recipe in which a group of steps (commands) of a control used in performing a film-forming method to be described later are set. The process recipe may be stored in a storage medium such as a hard disk and installed to the computer from the storage medium, or may be acquired from a network connected to the controller 150 by using communication means. The controller 150 may control the film-forming apparatus 23 and the film-forming system 1 in cooperation with the controller 100. The controller 150 and the controller 100 are examples of the controller that controls the film formation of ruthenium by controlling the operation of the film-forming system 1.

When the ruthenium film may be formed from the bottom of the recess formed in the surface of the substrate W in a bottom-up manner, it is possible to avoid generation of voids and seams to be described later such that a low-resistance ruthenium layer may be formed. However, a ruthenium film (hereinafter, also referred to as "ruthenium pieces") is formed on the side wall (side portion) of the recess during the film-forming process. When the ruthenium pieces formed on the side wall are removed by etching, no ruthenium film exists in the side portion of the recess, such that the generation of voids may be avoided. Therefore, in the film-forming apparatus 23, ruthenium is grown in a bottom-up manner from the bottom of the recess by a DED method of repeatedly executing the formation of the ruthenium film (D: deposition) and the removal of the ruthenium pieces (E: etching).

In a case where the DED method is not used, an opening of the recess is closed by the ruthenium pieces formed on the side wall of the recess, which may generate a void, or a minute gap (seam) may be generated in the recess by formation of a conformal ruthenium film. In the film-forming method according to an embodiment of the present disclosure to be described later, the DED method enables bottom-up embedding of ruthenium in the recess such that a ruthenium wire or contact may be implemented while avoiding a void and a seam.

Therefore, after forming the ruthenium film in the recess, a gas containing ozone is supplied from the second supply line 132 into the processing container 101, and the ruthenium pieces formed on the side wall of the recess are etched and removed by the ozone gas.

However, the ruthenium film may be conformally etched by the etching with the ozone gas. Therefore, in a case where an etching rate is high, not only the ruthenium pieces on the side wall of the recess but also the ruthenium layer at the bottom of the recess may be etched.

Therefore, the following film-forming method according to the present embodiment provides a method capable of suppressing etching of the ruthenium layer embedded in the bottom of the recess while etching the ruthenium pieces on the side wall of the recess.

First Embodiment

[Film-Forming Method]

Figure 3:
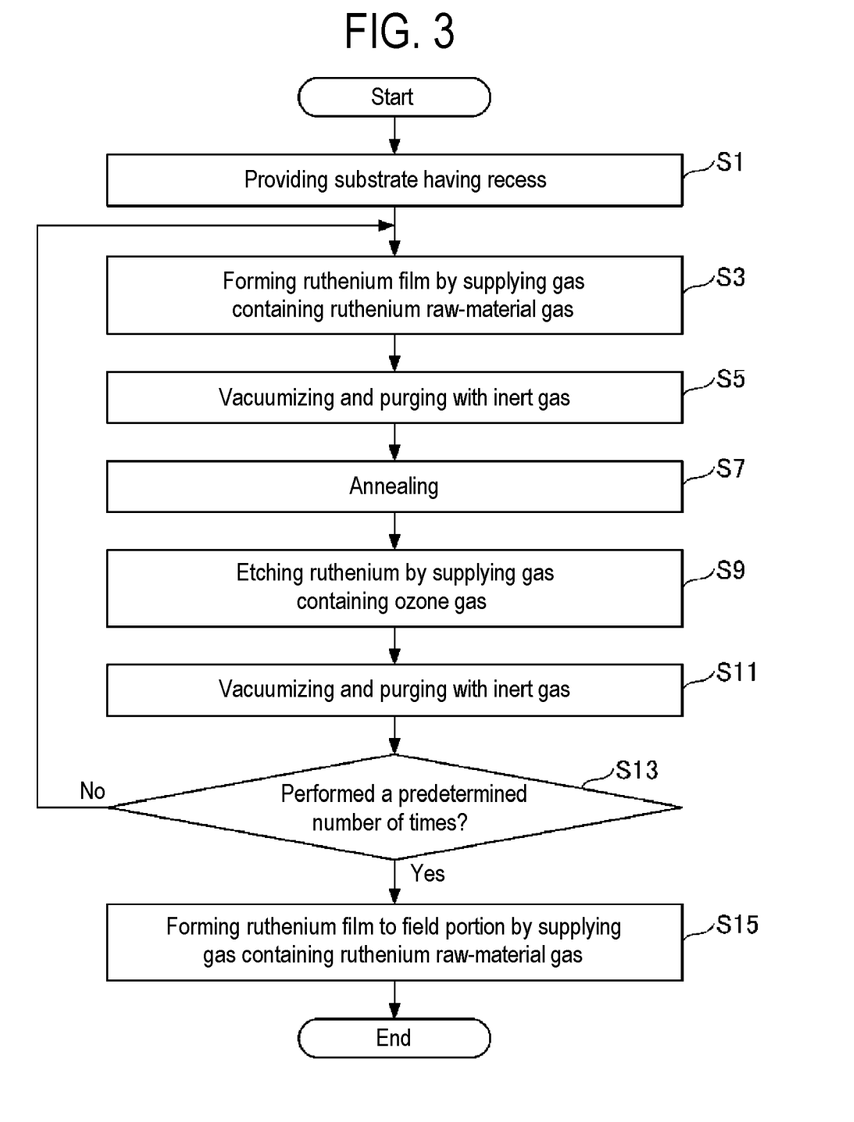
FIG. 3 is a flowchart illustrating an example of a film-forming method according to a first embodiment of the present disclosure.

An example of a film-forming method according to a first embodiment of the present disclosure executed by the film-forming system 1 will be described with reference to FIGS. 2 to 4D in addition to FIG. 1. FIG. 3 is a flowchart illustrating an example of a film-forming method according to the first embodiment. FIGS. 4A to 4D are cross-sectional views of a recess of a substrate in the film-forming method of FIG. 3.

(Substrate Provision Step: Step S1)

The film-forming method illustrated in FIG. 3 is executed by cooperation of the controller 100 and/or the controller 150. For example, the controller 150 initiates this process according to a process recipe in response to commands from the controller 100. When this process is initiated, in step S1, the controller 100 loads a substrate W having a recess into any of the cleaning apparatuses 21 and 22.

Figure 4A:
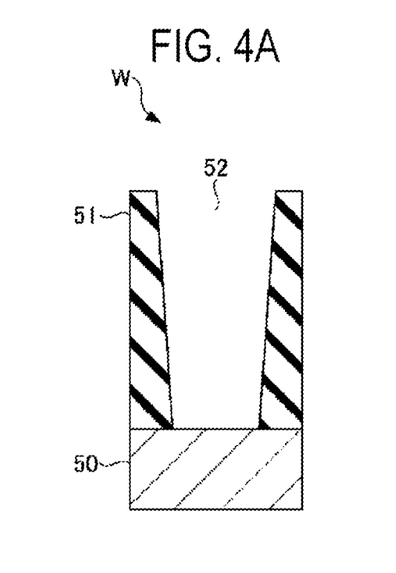
FIGS. 4A to 4D are cross-sectional views illustrating a recess in a substrate in the film-forming method of FIG. 3.

As illustrated in FIG. 4A, an insulating film having a recess 52, for example, a silicon oxide film ($SiO_x$ film) 51 is formed on the surface of the loaded substrate W. A metal layer 50 of tungsten or the like is formed below the silicon oxide film 51.

The controller 100 first takes out the substrate accommodated in the carrier C by the atmospheric transport mechanism 11a illustrated in FIG. 1, delivers the substrate to a load-lock chamber 12 in an atmospheric pressure atmosphere, and adjusts the load-lock chamber 12 to a vacuum pressure atmosphere. Next, the controller 100 transports the substrate in the load-lock chamber 12 to any of the cleaning apparatuses 21 and 22 by the first transport mechanism 13a, and performs a pre-cleaning process. In the pre-cleaning process, the metal oxide film formed on the metal layer 50 at the bottom of the recess 52 illustrated in FIG. 4A is reduced and removed by hydrogen plasma obtained by turning hydrogen gas into plasma. In this example, the metal oxide film is a tungsten oxide film.

(Ruthenium Film Formation (Embedding) Step: Step S3)

Next, the controller 100 provides the substrate by transporting the substrate to any of the film-forming apparatuses 23 and 24 via the first transport mechanism 13a illustrated in FIG. 1, or to any of the film-forming apparatuses 25 and 26 via the first transport mechanism 13a, the transfers 17, and the second transport mechanism 14a.

In the film-forming apparatus 23, the controller 150 forms a ruthenium layer in a region including the bottom of the recess 52. Specifically, the controller 150 loads the substrate into the processing container 101, places the substrate on the stage 102, heats the substrate with the heater 105, and vacuum-exhausts the interior of the processing container 101 by the gas exhaust 180.

Figure 4B:
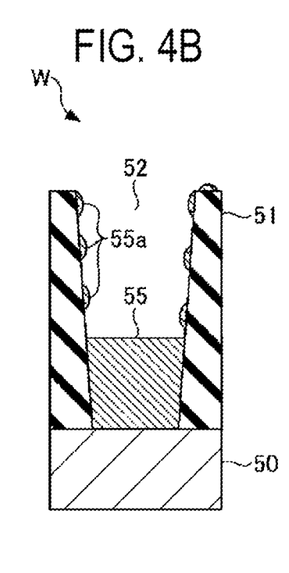

In step S3 of FIG. 3, the process is controlled under the following process condition, and as shown in FIG. 4B, ruthenium is embedded in a region including the bottom of the recess 52 with a vaporized ruthenium raw material gas to form a ruthenium layer 55.

<Ruthenium Embedding Process Condition>
Gas: DCR raw material gas, CO gas
Flow rate of CO gas: 50 to 300 sccm
Pressure in processing container: 10 to 200 mTorr (1.33 to 26.7 Pa)
Temperature of stage: 100 to 250 degrees C.

In the raw material container 161 illustrated in FIG. 2, the DCR, which is raw material S of ruthenium, is heated by the heater 162. The valves 137a and 137b provided at the carrier gas supply pipe 133 of the first supply line 131 are opened, and the CO gas, which is a carrier gas having a flow rate controlled by the mass flow controller 136, is supplied to the raw material container 161. The ruthenium raw material gas is vaporized by heating with the heater 162. Further, the valves 139a and 139b provided at the supply pipe 140 are opened.

The valves 177a and 177b provided at the supply pipe 175 of the second supply line 132 are closed. As a result, the vaporized raw material gas is supplied into the processing container 101, and a ruthenium layer 55 is formed in the recess 52. A gas containing the ruthenium raw material gas is supplied into the processing container 101 to form a ruthenium layer 55. During the film formation, the ruthenium film (hereinafter, also referred to as "ruthenium pieces 55a") is partially formed on the side wall in the recess 52.

In step S3, the valves 183a and 183b of the exhaust pipe 188 are opened while the ruthenium film is being formed. The exhaust pipe 188 roughly exhausts the interior of the processing container 101 by using the dry pump (DP1) 185, and then vacuumizes the interior of the processing container 101 by using the pressure adjuster 181 and the turbo molecular pump 182, thereby exhausting the gas containing the ruthenium raw material gas from the container 101. After a predetermined time has elapsed from the initiation of the process of step S3, the controller 150 closes the valves 139a and 139b and the valves 137a and 137b to stop the supply of the gas containing the ruthenium raw material gas.

(Vacuumizing Step: Step S5)

Next, in step S5 of FIG. 3, the interior of the processing container 101 is vacuumized by using the exhaust apparatuses (the dry pump DP1 and the turbo molecular pump 182) connected to the exhaust pipe 188. As a result, the gas containing the ruthenium raw material gas is exhausted. In step S5, purge may be performed together with the above-mentioned vacuumizing. In the purge step, an inert gas such as Ar gas or $N_2$ gas is supplied into the processing container 101, and the gas containing the ruthenium raw material gas in the processing container 101 is replaced with the inert gas.

(Annealing Step: Step S7)

Next, in step S7 of FIG. 3, the formed ruthenium layer is annealed. In this case, the controller 100 transports the substrate to the annealing apparatus 28 via the second transport mechanism 14a. Then, the annealing apparatus 28 is controlled under the following process condition and heats the transported substrate W at a predetermined temperature.

<Annealing Process Condition>
Gas: $N_2$ gas
Flow rate of $N_2$ gas: 1,000 to 5,000 sccm
Pressure in processing container: 5 Torr Temperature of stage: 300 to 400 degrees C.
(Ruthenium Etching Step: Step S9)

Next, in step S9 of FIG. 3, the process is controlled under the following process condition, and the ruthenium pieces 55a attached to the side wall of the recess 52 are etched and removed.

<Etching Process Condition>
Gas: Mixed gas of $O_3$ and $O_2$
Concentration of $O_3$ gas): 100 to 400 $g/m_3$
Flow rate of 02 gas: 400 to 20,000 sccm
Pressure in processing container: 0.1 to 3 Torr (13.3 to 400 Pa)
Temperature of stage: 100 to 250 degrees C.

Figure 4C:
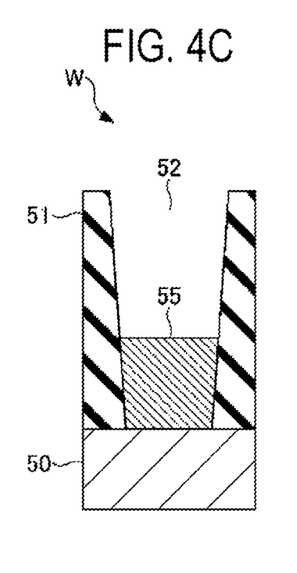

In step S9, in a state where the valves 139a and 139b provided at the supply pipe 140 of the first supply line 131 illustrated in FIG. 2 are closed, the valves 177a and 177b provided at the supply pipe 175 of the second supply line 132 are opened. In the second supply line 132, the mixed gas of $O_3$ and $O_2$ having a predetermined concentration and output from the ozonizer 173 is supplied into the processing container 101. As a result, a gas containing ozone gas is supplied into the processing container 101, the ruthenium layer 55 and the ruthenium pieces 55a illustrated in FIG. 4B are etched, and the ruthenium pieces 55a are removed from the side wall of the recess 52 as illustrated in FIG. 4C. Further, in a state where the valves 183a and 183b of the exhaust pipe 188 are opened, the residual gas of the gas containing ozone gas is exhausted via the exhaust pipe 188. After a predetermined time has elapsed from the initiation of the process of step S9, the controller 150 closes the valves 177a and 177b to stop the supply of the gas containing ozone gas to the processing container 101.

(Vacuumizing Step: Step S11)

In step S11, the interior of the processing container 101 is vacuumized by using the exhaust apparatus connected to the exhaust pipe 188. As a result, the gas containing ozone gas is exhausted. Purge may be performed together with the above-mentioned vacuumizing. In the purge step, an inert gas is supplied into the processing container 101, and the gas containing ozone gas in the processing container 101 is replaced with the inert gas.

(Determination Step: Step S13)

Next, in step S13, the controller 150 determines whether or not the processes of steps S3 to S11 have been performed a predetermined set number of times. When the controller 150 determines that the processes of steps S3 to S11 have not been executed the set number of times, the controller 150 returns to step S3 and executes steps S3 to S11. As a result, the film formation illustrated in FIG. 4B and the etching illustrated in FIG. 4C are repeated the set number of times. This makes it possible to perform the film formation and the etching of ruthenium with the same film-forming apparatus.

When the controller 150 determines in step S13 that the processes of steps S3 to S11 have been executed the set number of times, the substrate W is carried out, and the controller 100 transmits the substrate to the film-forming apparatus 27 via the first transport mechanism 13a, the transfers 17, and the second transport mechanism 14a.

(Ruthenium Film Formation (Laminating) Step: Step S15)

Figure 4D:
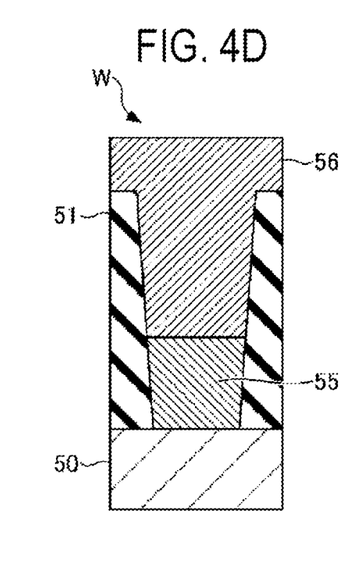

Next, in step S15 of FIG. 3, a ruthenium layer 56 is laminated on the field portion of the upper layer of the ruthenium layer 55 formed at the bottom of the recess 52 by a ruthenium raw material gas vaporized under the following process condition. As a result, as illustrated in FIG. 4D, the ruthenium layer 56 is formed on the ruthenium layer 55 embedded in the recess of the substrate W. The opening and closing of each valve is the same as that during the embedding ruthenium in step S3.

<Ruthenium Laminating Process Condition>
Gas: DCR raw material gas, CO gas
Flow rate of CO gas: 50 to 300 sccm
Pressure in processing container: 10 to 200 mTorr
Temperature of stage: 100 to 250 degrees C.

An annealing step may be executed after the ruthenium laminating step of step S15. When executing the annealing step, the process condition may be the same as that in step S7.

Actions of the above-described film-forming method will be described. When the gas containing the ozone gas is supplied to the ruthenium layer 55 formed in the recess of the substrate, chemical reaction (1) between the ruthenium layer 55 and the ozone gas is represented by $Ru + \frac{2}{3}O_3 \rightarrow RuO_2$. In this chemical reaction (1), the surface of the ruthenium layer 55 is oxidized to form a ruthenium oxide film 55b of $RuO_3$.

In addition, chemical reaction (2) between the ruthenium layer 55 and ozone gas is represented by $Ru + \frac{4}{3}O_3 \rightarrow RuO_4$. Chemical reaction (3) between the ruthenium oxide film ($RuO_2$) 55b and ozone gas is represented by $RuO_2 + \frac{2}{3}O_3 \rightarrow RuO_4$. $RuO_4$ formed by these chemical reactions (2) and (3) is volatilized. As a result, the surface of the ruthenium layer 55 and the ruthenium pieces 55a (see FIG. 4B) are etched and removed.

In the film-forming method of FIG. 3, the purge processes of steps S5 and S11 may be omitted, and only the vacuumizing process may be performed.

As described above, in the film-forming method according to the first embodiment, ruthenium is embedded in the substrate having the recess by the following steps (a) to (d). That is, the film-forming method according to the first embodiment may include:

(a) providing the substrate in the processing container;
(b) supplying a gas containing a ruthenium raw material gas into the processing container to form a ruthenium layer;
(c) annealing the ruthenium layer; and
(d) supplying a gas containing an ozone gas into the processing container to etch the ruthenium layer,
wherein (b), (c), and (d) are repeatedly executed in this order. The aforementioned (b) and (c) are executed in the same film-forming apparatus.

In the film-forming method of the present disclosure, the ruthenium film formation step and an annealing are repeated, whereby it is possible to improve an etching resistance of the ruthenium layer, such that an etching amount of ruthenium may be controlled. The reason will be described with reference to FIG. 5.

Figure 5:
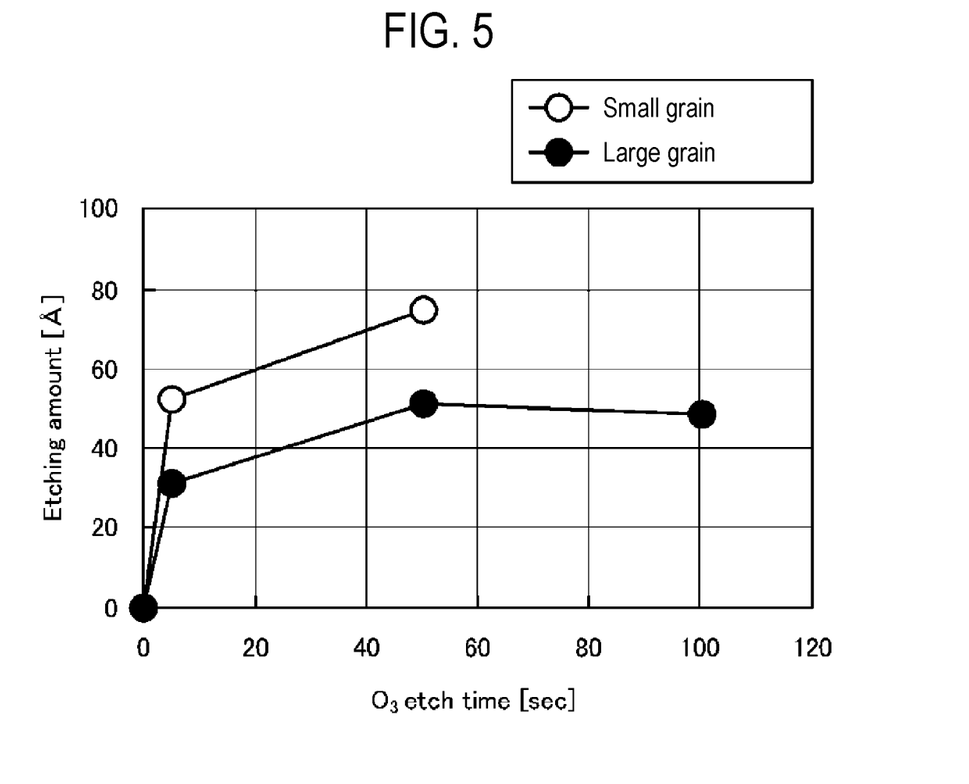
FIG. 5 is a view illustrating a relationship between an etching time by an ozone gas and an etching amount of ruthenium.

FIG. 5 is a view illustrating a relationship between an etching time by ozone gas and an etching amount of ruthenium. The horizontal axis of FIG. 5 represents a period of time from the initiation of the supply of ozone gas, that is, the etching time by the ozone gas, and the vertical axis represents the etching amount of ruthenium per unit time.

FIG. 5 shows that an etching rate of ruthenium changes depending on the grain size (crystal size) of ruthenium. When the grain size of ruthenium is small (small grain in FIG. 5), the etching amount of ruthenium is larger than that in the case where the grain size of ruthenium is large (large grain in FIG. 5). That is, the ruthenium layer having a large grain size may lower the etching rate compared with the ruthenium layer having a small grain size such that the etching of ruthenium may be suppressed. Therefore, an annealing process is performed after the film formation of ruthenium. As a result, the grains of the ruthenium layer 55 embedded in the recess are grown to form a crystal structure having a large grain size.

The ruthenium layer 55 embedded in the bottom of the recess has a relatively larger amount of ruthenium than the ruthenium pieces 55a attached to the side wall of the recess. Therefore, by performing the annealing process for a predetermined period of time, in the ruthenium layer 55 at the bottom of the recess, a relatively larger amount of ruthenium may be grown into grains compared with the ruthenium pieces 55a on the side portion of the recess. This makes it possible to make the grain size of the ruthenium layer 55 relatively larger than the grain size of the ruthenium pieces 55a on the side wall. This makes it possible to make the etching rate of the ruthenium layer 55 at the bottom lower than the etching rate of the ruthenium pieces 55a on the side portion. As a result, in the ruthenium etching step by using the ozone gas, it is possible to suppress the etching of the ruthenium layer 55 formed at the bottom of the recess while removing the ruthenium pieces 55a on the side wall of the recess.

That is, it is possible improve the etching resistance of the ruthenium layer 55 by annealing the ruthenium layer 55 to be grown into grains. Further, by further forming a ruthenium film on the substrate after the annealing process, gaps generated when agglomerated may be filled with ruthenium. When heat is applied to the ruthenium layer 55 by annealing, ruthenium atoms becomes easy to move. As a result, agglomeration of ruthenium may occur, and the agglomeration may generate gaps in the ruthenium layer. However, it is possible to embed ruthenium in the gaps through film formation of ruthenium. This makes it possible to form the ruthenium layer 55 free of gaps.

Further, by repeating the ruthenium film formation step (step S3), the annealing step (step S7), and the step of etching ruthenium with the ozone gas (step S9), the ruthenium layer 55 formed at or before the previous time is grown into grains by the annealing. As a result, the ruthenium layer 55 formed at or before the previous time has a relatively larger grain size as compared with the grain size of the ruthenium film formed at the present time.

Therefore, by repeating the processes of steps S3, S7, and S9, it is possible to further improve the etching resistance of the ruthenium layer 55. As a result, in the step of etching ruthenium with the ozone gas, it is possible to suppress the etching of the ruthenium layer 55 embedded in the bottom of the recess while removing the ruthenium pieces 55a by the etching. This makes it possible to control the etching amount of the ruthenium layer 55 in the etching of the ruthenium pieces 55a performed when embedding the ruthenium in the recess.

In the film-forming method of FIG. 3, the etching resistance of the ruthenium layer 55 is improved by performing the annealing step after the ruthenium film formation step. However, the present disclosure is not limited thereto, and the annealing step may be performed once whenever the ruthenium film formation step and the ruthenium etching step are repeated a plurality of times. According to this, it is possible to improve a throughput while obtaining the etching resistance of the ruthenium layer 55 to some extent.

Second Embodiment

[Film-Forming Method]

In the first embodiment, the ruthenium film formation step (step S3), the annealing step (step S7), and the step of etching ruthenium with the ozone gas (step S9) are repeated in this order, but the present disclosure is not limited thereto. In the film-forming method according to the second embodiment, the ruthenium film formation step (step S3), the ruthenium etching step with the ozone gas (step S9), and the annealing step (step S7) are repeated in this order.

Figure 6:
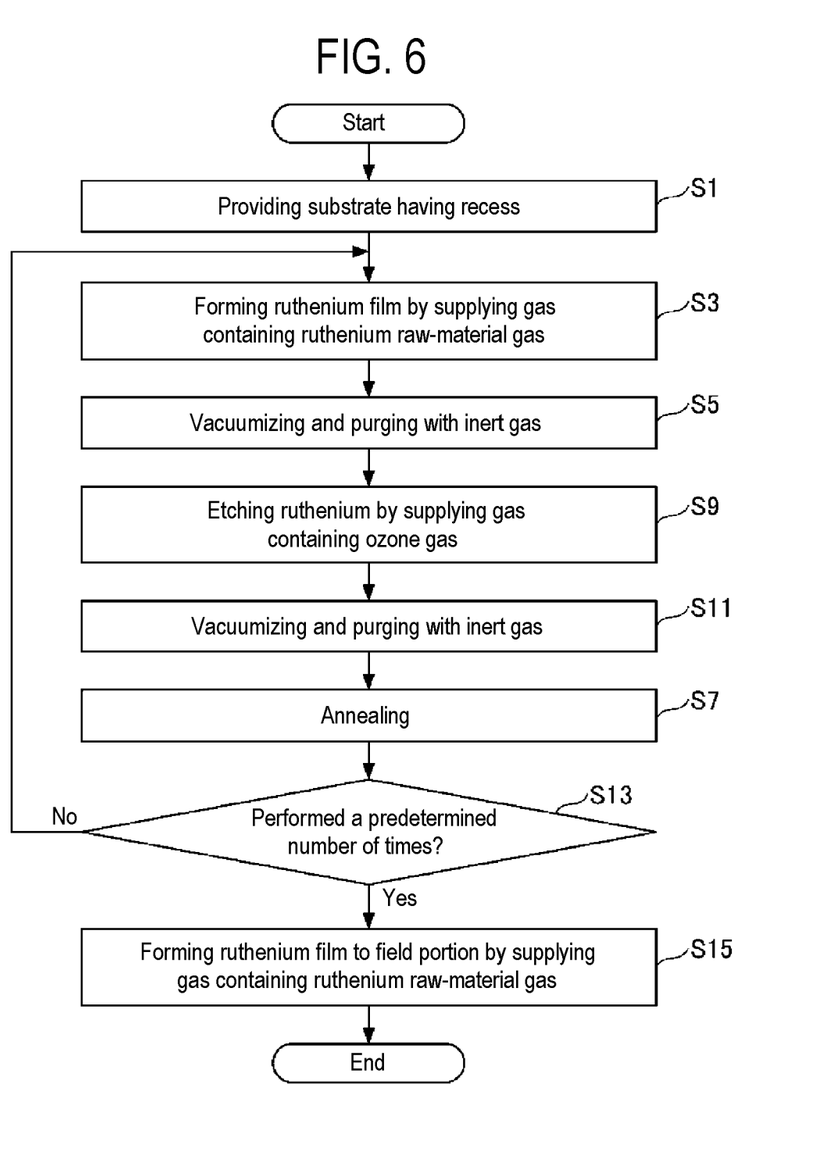
FIG. 6 is a flowchart illustrating an example of a film-forming method according to a second embodiment of the present disclosure.

An example of the film-forming method according to the second embodiment, which is executed by the film-forming system 1, will be described with reference to FIG. 6. FIG. 6 is a flowchart illustrating an example of the film-forming method according to the second embodiment. In each step of FIG. 6, in the step having the same step number as in FIG. 3, the same process as in FIG. 3 is performed.

In the film-forming method according to the second embodiment, the annealing step (step S7) is executed after the step of etching ruthenium with the ozone gas following the ruthenium film formation step, and each step is repeated in this order. Specifically, the ruthenium film formation step (step S3) is followed by the vacuumizing step (step S5), and the step of etching ruthenium with the ozone gas (step S9) is followed by the vacuumizing step (step S11). Thereafter, the annealing step (step S7) is performed. The process condition in each step and other film-forming methods are the same as those of the film-forming method according to the first embodiment.

As described above, in the film-forming method according to the second embodiment, ruthenium is embedded in a substrate having a recess by the following steps (a) to (d). That is, the film-forming method according to the second embodiment may include:

(a) providing the substrate in the processing container;
(b) supplying a gas containing a ruthenium raw material gas into the processing container to form a ruthenium layer;
(c) supplying a gas containing an ozone gas into the processing container to etch the ruthenium layer; and
(d) annealing the ruthenium layer, wherein steps (b), (c), and (d) are repeatedly executed in this order. The aforementioned (b) and (d) are executed in the same film-forming apparatus.

As a result, by repeating the film formation and the etching of ruthenium in the same film-forming apparatus, the ruthenium layer may be formed in the recess of the substrate in a bottom-up manner without generating a void. In the film-forming system 1, the film-forming process and annealing are repeated, whereby it is possible to improve the etching resistance of the ruthenium layer, such that the etching amount of ruthenium can be controlled.

In the film-forming method according to the second embodiment as well, the film formation and the annealing of ruthenium are repeated, whereby it is possible to improve the etching resistance of the ruthenium layer, such that the etching amount of ruthenium may be controlled.

As described above, according to the film-forming method and the film-forming system of the present embodiment, it is possible to execute the film formation and the etching of ruthenium in the same film-forming apparatus and to embed ruthenium in the bottom of the recess in a bottom-up manner. While ruthenium is being embedded in the bottom of the recess, it is possible to control the etching amount of ruthenium to suppress the etching amount of the ruthenium layer at the bottom of the recess while removing ruthenium pieces that have adhered to the side portion of the recess by etching.

It should be considered that the film-forming system and the film-forming method according to the embodiments disclosed herein are exemplary in all aspect and are not restrictive. The embodiments may be modified and improved in various forms without departing from the scope and spirit of the appended claims. The matters described in the above embodiments may take other configurations or may be combined within a non-contradictory range.

In the film-forming apparatus of the present disclosure, it is also possible to clean the processing container 101 when supplying the gas containing the ozone gas. By the ozone gas supplied from the ozonizer 173 to the processing container 101, it is possible to perform not only etching of ruthenium that has adhered to the side portion of the recess, but also cleaning of ruthenium deposited on a wall surface or the like of the processing container 101.

According to the embodiments of the present disclosure, it is possible to control the etching amount of the ruthenium layer in the embedding of ruthenium in the recess.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film-forming method of embedding ruthenium in a substrate having a recess, the film-forming method comprising:
   (a) providing the substrate in a processing container;
   (b) supplying a gas containing a ruthenium raw material gas into the processing container to form a ruthenium layer wherein the ruthenium layer is embedded in the recess;
   (c) annealing the ruthenium layer; and
   (d) supplying a gas containing an ozone gas into the processing container to etch ruthenium pieces formed on a side wall of the recess,
   wherein (b), (c), and (d) are repeatedly executed in this order.

2. The film-forming method of claim 1, wherein (b) and (c) are executed in a same film-forming apparatus.

3. A film-forming method of embedding ruthenium in a substrate having a recess, the film-forming method comprising:
   (a) providing the substrate in a processing container;
   (b) supplying a gas containing a ruthenium raw material gas into the processing container to form a ruthenium layer wherein the ruthenium layer is embedded in the recess;
   (c) supplying a gas containing an ozone gas into the processing container to etch ruthenium pieces formed on a side wall of the recess; and
   (d) annealing the ruthenium layer,
   wherein (b), (c), and (d) are repeatedly executed in this order.

4. The film-forming method of claim 3, wherein (b) and (d) are executed in a same film-forming apparatus.

* * * * *